United States Patent [19]
Bandali et al.

[11] Patent Number: 5,226,048
[45] Date of Patent: Jul. 6, 1993

[54] AT-SPEED TESTING OF CORE LOGIC

[75] Inventors: Behrooz Bandali, Pleasanton; Dan King, Fulton, both of Calif.

[73] Assignee: LSI Logic Corporation, Milpitas, Calif.

[21] Appl. No.: 632,012

[22] Filed: Dec. 21, 1990

[51] Int. Cl.$^5$ .............................. G01R 31/28
[52] U.S. Cl. ........................ 371/22.1; 371/25.1
[58] Field of Search ............ 371/22.1, 22.3, 25.1; 324/158 R, 73.1

[56] References Cited

U.S. PATENT DOCUMENTS 4,970,724 11/1990 Yung ......................... 371/9.1
5,049,814 9/1991 Walker et al. ............. 324/158 R Primary Examiner—Charles E. Atkinson
Attorney, Agent, or Firm—Gerald E. Linden; Michael D. Rostoker

[57] ABSTRACT

A technique for at-speed testing of the core logic of a digital integrated circuit device is disclosed. Test patterns are applied to the circuit inputs while applying a "burst" of three clock pulses followed by a "dead cycle" to the pipeline stages between the input logic, the core logic and the output logic. During the dead cycle, changes in the outputs of the device are observed during the dead cycle. Subsequently, a second burst of clock pulses, offset from the first burst, and followed by a dead cycle, is applied with re-initialized test patterns, and the outputs are observed during the dead cycle. Subsequently, a third burst of clock pulses, offset from the first and second bursts, and followed by a dead cycle, is applied with re-initialized test patterns, and the outputs are observed during the dead cycle. The results of the three iterations of the test are stored and merged to provide a valid indication of the performance of the device with a free running clock.

6 Claims, 2 Drawing Sheets

AT-SPEED TESTING OF CORE LOGIC

TECHNICAL FIELD OF THE INVENTION

The invention relates to testing digital integrated circuit devices, particularly those with input pipeline stages, internal sequential (core) logic, and output pipeline stages.

BACKGROUND OF THE INVENTION

Testing digital circuits is extremely important. Based on design and simulation results, sets of test vectors are generated for application to prototype circuits, and often test fixtures need to be customized, depending on operational characteristic of the circuit inputs and outputs. With synchronous circuits, propagation delays and timing closure are of particular concern.

For testing the interaction between discrete components, the situation is relatively straightforward. For example, U.S. Pat. No. 4,926,425 discloses a system for testing digital circuits, wherein test node equipment is provided between successive component groups operating in cascade.

A single-chip integrated circuit however, for example an Application Specific Integrated Circuit (ASIC), typically contains high speed sequential (core) logic, and input and output combinational logic stages surrounding the core logic and connected to respective input and output pads. Generally, the input and output stages cannot run as fast as the core logic, primarily due to input and output parasitic capacitances, which imposes some severe limitations on "At-Speed"or "AC"testing of the core logic.

In the prior art, various approaches to testing have been proposed. For example:

U.S. Pat. No. 4,638,246 discloses an integrated circuit input-output diagnostic system for detecting open connections at the input and output pads. Input activity and output load detector circuits are provided on-chip for this purpose.

U.S. Pat. No. 4,477,902 discloses a testing method for assuring AC performance of high performance random logic designs using a low speed tester. Outputs are strobed once every cycle, and the patent does not deal with I/O noise and cycle time limitations due to tester pin capacitances and tester edge placement inaccuracy.

In contrast thereto, in the present invention outputs are strobed every "N"cycles, where "N"is a number higher than two, and the insertion of a dead cycle before strobing allows output ringing to settle. Further, three-stating of the outputs during the clock burst mode reduces the possibility of double clocking caused by many outputs switching at the same time.

U.S. Pat. No. 4,813,001 discloses an AC calibration method for determining the transfer function of a data acquisition system. This patent relates to calibration and transfer function determination for linear systems and analog devices such as data acquisition systems.

In contrast thereto, the present invention is a methodical approach to noise reduction and at-speed testing of digital integrated circuits.

U.S. Pat. No. 4,870,345 discloses a semiconductor integrated circuit device which includes cascaded asynchronous sequential logic circuits. Scanning shift registers are provided between the asynchronous sequential circuits to permit test data to be applied to the inputs of the circuits and to latch and shift out output data provided by the circuits in response to the test data.

U.S. Pat. No. 4,764,926 discloses an integrated circuit having a built-in test facility, the integrated circuit being partitioned into a number of sub-circuits each of which comprises a combinational logic circuit and a register.

U.S. Pat. No. 4,800,564 discloses error detection and fault isolation in a high performance clock system in a data processor or the like. This patent describes means to detect faults on the clock line, which is only one of the possible nets in a design, and requires hardware (logic) implementation inside the chip to detect faults.

In contrast thereto, the present invention is not limited to the testing of a single net, and does not require any unique logic implementation for detection of AC faults.

The following references are exemplary of prior art digital logic test equipment:

U.S. Pat. No. 4,928,278 discloses an IC test system wherein timing errors of each of a number of tester pin electronics units is executed in parallel among the units or blocks thereof.

U.S. Pat. No. 4,726,025 discloses a timing cycle generator and verifier in which a PROM stores the timing constants that are employed by the generator. Two modes of operation are discussed.

U.S. Pat. No. 4,705,970 discloses a programmable interval

Application Note, "Automated Digital Signal Processing" (Massachusetts Computer corporation, 080-00976-00 0887-976) discloses a data acquisition user interface wherein a "virtual instrument"controls data acquisition and transmission devices, sampling rates, data display, file I/O multiplexing and demultiplexing, data flow and basic signal processing.

DISCLOSURE OF THE INVENTION

It is therefore an object of the present invention to provide a technique for testing core logic, at speed, by eliminating the limitations of surrounding input/output logic.

It is a further object of the present invention to provide a technique for testing core logic, at speed, without modifying the design of the device under test (such as by inserting registers between sequential logic stages).

It is a further object of the present invention to provide a technique for testing core logic, at speed, with conventional test equipment, readily configured to perform the disclosed technique.

According to the invention, the core logic of an integrated circuit device is tested at-speed by applying test patterns to the inputs while applying a "burst"of clock pulses followed by a "dead cycle"to the pipeline stages between the input logic, the core logic and the output logic. During the dead cycle, changes in the outputs of the device are observed.

Preferably, the burst comprises three clocks, followed by a dead cycle of at least one clock.

According to an aspect of the invention, three test passes are made. In one pass, the dead cycle occurs after three initial clocks. In another test pass, the dead cycle occurs after one initial clock, and after subsequent bursts of three clocks. In yet another pass, the dead cycle occurs after two initial clocks, and after subsequent bursts of three clocks. This will ensure that the outputs of the device are strobed on each cycle of the original functional (test) patterns, and that there is no loss of observability due to tri-stating the outputs during the clock burst.

The input test patterns are re-initialized for each pass, and the results of the three iterations (test passes) of the test are stored and merged to provide a valid indication of the performance of the device with a free running clock.

Other objects, features and advantages of the present invention will become evident in light of the following description thereof.

DETAILED DESCRIPTION OF THE INVENTION

Figure 1:
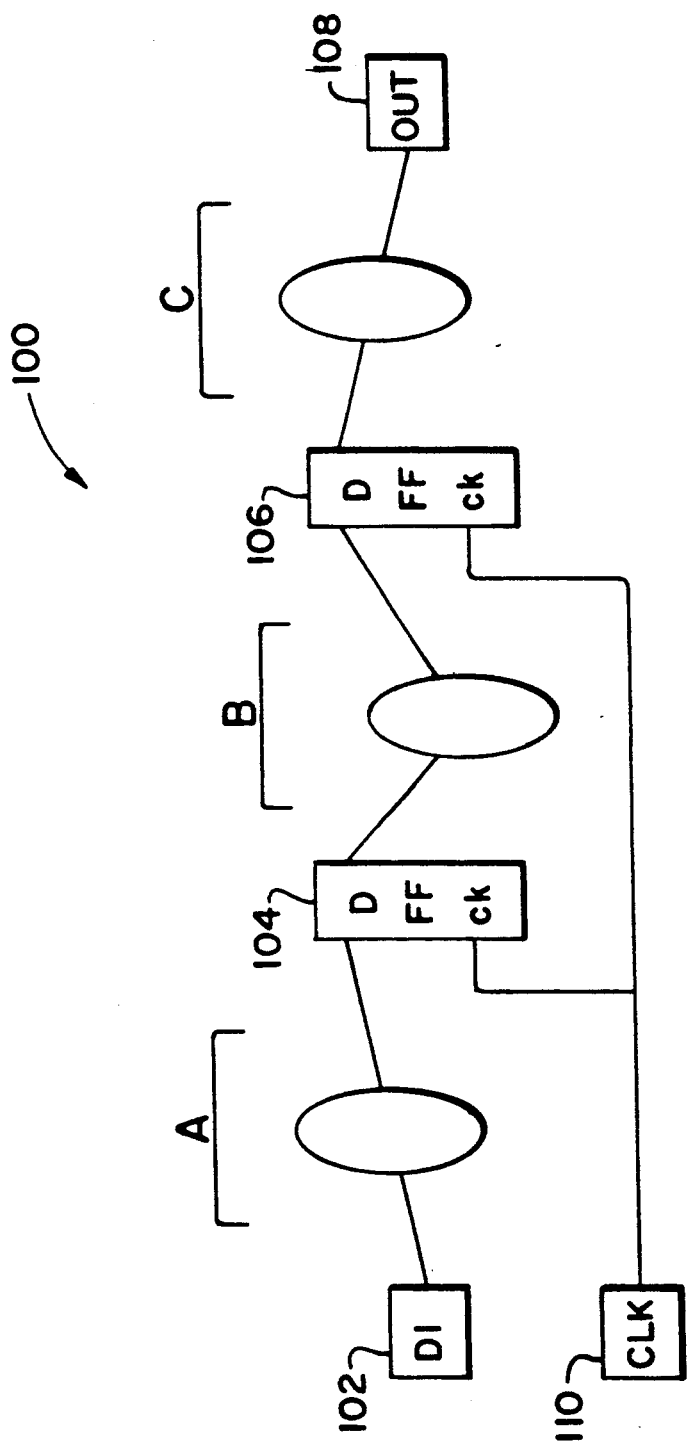
FIG. 1 is a simplified block diagram of an integrated circuit device architecture having a combinational logic input stage "A", a combinational logic output stage "C", sequential core logic "B", and pipeline stages between the input stage and core logic and between the core logic and the output stage.

FIG. 1 is a generalized schematic of a representative semiconductor device 100 having three logic portions: a portion "A", which represents combinational logic receiving data from input pins 102; an input pipeline stage 104; a portion "B", which represents internal sequential logic; an output pipeline stage 106; and a portion "C", which represents combinational logic providing data to output pins 108. For illustrative clarity, feedback paths are omitted from the Figure.

The representative device 100 is a synchronous device, and a clock input 110 to the pipeline stages 104 and 106 is illustrated. Propagation delays through the various stages are inherent in such a design, and must be tested and verified prior to manufacture of a production device.

The performance of the device 100 can be broken down into three areas; the delay in section "A", the delay in section "B" and the delay in section "C". Section "A" can be tested using conventional techniques to determine input timing requirements such as the setup and hold time. Section "C" can similarly be tested using conventional techniques for critical delay from the time a clock pulse is applied to the time the output changes. The present invention deals primarily with at-speed testing of Section "B", hereinafter referred to as the "core logic", with the clock running at the "rated" system clock speed.

The traditional approach to at-speed testing is to take functional patterns and increase the clock cycles. This approach is not practical in many cases, for the following reasons. The tester output capacitance (which typically range from 35 pf to 110 pf) can prohibit running the system to full ("rated") speed. The input rise/fall time mismatch between system application and tester causes a correlation problem. It is inaccurate - the error factor is the sum of driver edge placements accuracy, comparator accuracy, tester output capacitance inaccuracy, input capacitance and slew rate inaccuracy. Output impedance mismatches can cause reflection and ringing, and custom terminations for each pin may be needed. Another problem is potential ground bounce, causing double clocking, due to all inputs switching at the same time right before the clock edge with a fast slew rate. The traditional approach requires custom hardware development to deal with these issues, and valuable product development time will inevitably be spent in generation of customized test patterns, programs, and the test fixture, which make it impractical in the ASIC development environment.

Since the at-speed testing technique of the present invention is targeted at the internal core logic "B", the parameters associated with the input and output logic sections "A" and "C" can be relaxed, thereby eliminating the aforementioned limitations of traditional at-speed testing.

The at-speed testing technique of the present invention overcomes these limitations by:

applying inputs (test vectors) and a sequence ("burst") of "N" clocks, where "N" is a fixed number (integer greater than two, preferably three);

three-stating, or masking, the device outputs when the clock and inputs are applied;

stopping the clock for one or more cycles ("dead cycle"); and strobing the device outputs during the dead cycle, when the inputs and the clock are not switching.

Figure 2:
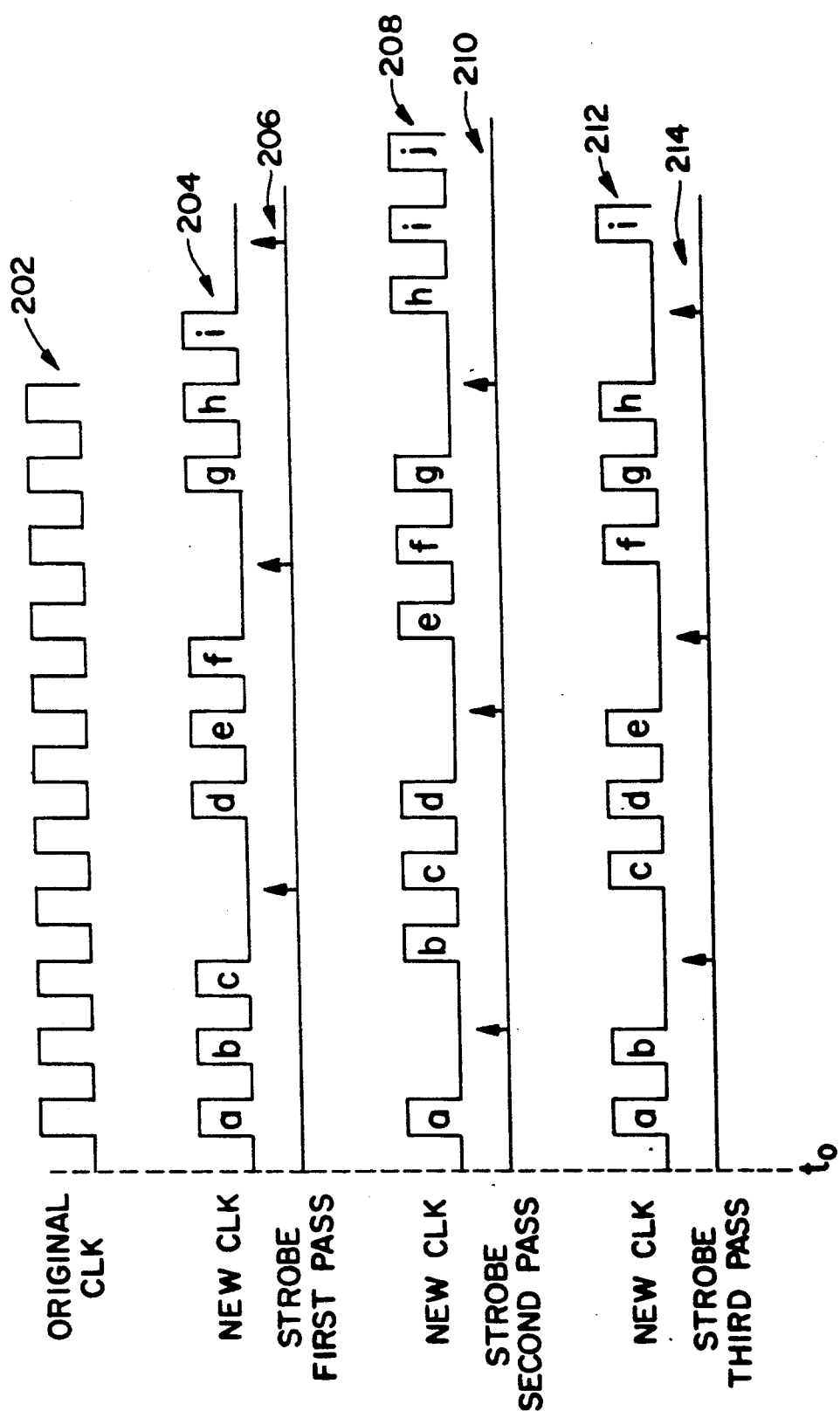
FIG. 2 is a timing diagram illustrating the at-speed testing technique of the present invention.

FIG. 2 shows the critical timing relationships for implementing the technique of the present invention.

A sequence of "original" clock pulses 202 are provided at the "rated" speed for the device under test. The period of the pulses is "t".

A first stream of "new" clock pulse stream 204 is generated wherein a sequence of "N" clock pulses at the rate (1/t) of the "original" clock pulses are generated, followed by a "dead cycle" (no clock pulse) equivalent to at least one period "t" (clock cycle). The pulses in the first new clock pulse stream 204 are conveniently identified with letters a-i, for reference to individual pulses. After the dead cycle, the pattern of "N" new clock pulses followed by another dead cycle is repeated. In other words, there is a dead cycle after pulses 204c, 204f and 204i, etc.

The first new clock pulses 204 are applied to the pipeline stages of the device under test (see 104 and 106, FIG. 1) while test patterns, initialized at time $t_0$, are applied to the device inputs (see 102, FIG. 1).

During the dead cycles in the first pass, there are no clock pulses driving the pipeline stages and, preferably, the test patterns are terminated. Further, during the dead cycle, a strobe 206 is generated, and applied to the tester (not shown) for reading the outputs of the device under test. The strobe 206 preferably occurs after expiration of a time "t" (equivalent to one clock cycle) after completion of the third new clock 204c (or 204f and 204i, etc.).

In a similar manner, a second new clock pulse stream 208 is generated. The pulses are conveniently lettered a-j, for reference to individual pulses. In this pulse stream 208, a dead cycle is provided after only one new clock pulse 208a, and thereafter is provided after a sequence of "N" clock pulses, i.e. after the fourth and seventh clock pulse 208d and 208g, etc.

The second new clock pulses 204 are applied to the pipeline stages of the device under test (see 104 and 106, FIG. 1) while the same re-initialized test patterns are applied to the device inputs (see 102, FIG. 1), as in the first pass.

During the dead cycles in the second pass, there are no clock pulses driving the pipeline stages and, preferably, the test patterns are terminated. Further, during the dead cycle, a strobe 210 is generated, and applied to the tester (not shown) for reading the outputs of the device under test. The strobe 210 preferably occurs after expiration of a time "t"(equivalent to one clock cycle) after completion of the first, fourth and seventh clock pulses 208a, 208d and 208g, etc.

Again, in a similar manner, a third new clock pulse stream 212 is generated. The pulses are conveniently lettered a-h, for reference to individual pulses. In this pulse stream 212, a dead cycle is provided after an initial two clock pulses 212a and 212b, and thereafter is provided after a sequence of "N"clock pulses, i.e. after the fifth and eighth clock pulses 212e and 212h, etc.

The third new clock pulses 212 are applied to the pipeline stages of the device under test (see 104 and 106, FIG. 1) while the same, re-initialized test patterns are applied to the device inputs (see 102, FIG. 1), as in the first pass.

During the dead cycles in the third pass, there are no clock pulses driving the pipeline stages and, preferably, the test patterns are terminated. Further, during the dead cycle, a strobe 214 is generated, and applied to the tester (not shown) for reading the outputs of the device under test. Again, he strobe 214 preferably occurs after expiration of a time "t"(equivalent to one clock cycle) after completion of the second, fifth and eighth clock pulses 212b, 212e and 212h, etc.

The results of the three test passes (iterations), are saved and merged to arrive at a valid indication of the performance of the device with a free running clock. The timing relationship between the three new clock streams 204, 208 and 212 is not particularly important, so long as the first pulse in each stream 204a, 208a and 212a is referenced to the same initial reference point, $t_0$, at which the test patterns are initialized.

Thus, it is seen that by having three "offset"test passes, each having a burst of three at-speed clocks, the outputs of the device may be examined during dead cycles following a first (208a), a second (212b), a third (204c), a fourth (208d), a fifth (212e), a sixth (204f), a seventh (208g), an eighth (212h) and a ninth (204i) clock pulse, etc.

The dead cycle is established to be at least one clock in duration, and is long enough to allow external output delays and ringing to settle out and short enough to allow dynamic logic to retain its state.

Preferably, each burst of clock pulses contains three clocks. A general reason for this is that the first clock hits the pipeline after the inputs have been static (e.g., after the dead cycle), the second clock gets things going in a dynamic state, and the third clock allows signals to make it through the pipeline latches to the output. Looking at the situation another way, after the first clock pulse it is possible that errors in stage "A"will not have propagated through pipeline 104 (see FIG. 1), after the second clock pulse there is assurance that the errors have propagated to stage "B", and after the third clock pulse there is assurance that the errors have propagated through to the device outputs. In other words, the third clock pulse of each burst ensures that the sought after results make their way out of the device. With a burst of three clock pulses, a situation approximating a full dynamic condition is initiated, which is a valid indication of the performance of the device with a free running clock.

Preferably, three passes are executed, as described above. With three passes, there is assurance of having two overlaps between sequential logic states in the core logic "B". Two passes would not produce this desirable result. More than three passes is generally not necessary. Further, there are ensured overlaps between the three offset passes.

Advantageously, inputs and outputs having the same timing relationships can be grouped together for purposes of the at-speed testing technique of this invention. Such grouping will make the characterization, and analysis of its results, manageable. The input pins which are defined to be in the same group can share the same timing generators for splots. The output pins that are grouped together can be tested against the same tester strobe setting. If any of the outputs in a specific group fails to meet the limits, the splot will show a failure. Full characterization, where all the input and output delays and the timing relationships are individually measured is not recommended. The completion time would be very long and costly.

The invention provides a structured method of dealing with the limitations that the I/O sections of an integrated circuit place on at-speed testing of the core sequential logic.

What is claimed is:

1. Method of testing an integrated circuit device having inputs, an input combinational logic stage, outputs, an output combinational logic stage, a core sequential logic stage connected by pipeline stages between the input and output stages and a clock input to the pipeline stages, comprising:

providing a stream of clock pulses of period "t";

generating a first stream of clock bursts including a sequence of three first new clock pulses of period "t" followed by a first dead cycle having a duration of at least "t";

generating a second stream of clock bursts including a sequence of three second new clock pulses of period "t" followed by a second dead cycle having a duration of at least "t";

generating a third stream of clock bursts including a sequence of three third new clock pulses of period "t" followed by a third dead cycle having a duration of at least "t";

offsetting the first, second and third streams of clock bursts, to ensure that there is a dead cycle following every clock pulse;

providing a first strobe during the first dead cycles, at a time at least "t" after the last of each three of the first new clock pulses in the bursts of three first new clock pulses;

providing a second strobe during the second dead cycles, at a time at least "t" after the last of each three of the second new clock pulses in the bursts of three second new clock pulses;

providing a third strobe during the third dead cycles, at a time at least "t" after the last of each three of the third new clock pulses in the bursts of three third new clock pulses;

in a first pass, applying the first stream of clock bursts to the clock input of the pipeline stages, while applying test patterns to the inputs of the device;

in a second pass, applying the second stream of clock bursts to the clock input of the pipeline stages, while applying the same test patterns to the inputs of the device;

in a third pass, applying the stream of clock bursts to the clock input of the pipeline stages, while applying the same test patterns to the inputs of the device;

in the first pass, strobing, with the first strobe, the outputs of the device, and reading the resultant states of the outputs;

in the second pass, strobing, with the second strobe, the outputs of the device, and reading the resultant states of the outputs; and in the third pass, strobing, with the third stroke, the outputs of the device, and reading the resultant states of the outputs.

2. Method, according to claim 1, wherein:
the duration of the dead cycle is sufficient to allow external output delays and ringing to settle out, and short enough to allow dynamic logic to retain its state.

3. Method, according to claim 1, further comprising: referencing each of the first, second and third streams of clock bursts to a common reference time $t_0$.

4. Method, according to claim 1, further comprising: performing sufficient passes to ensure that there are two overlaps between sequential logic states in the core logic.

5. Method, according to claim 1, further comprising: three-stating, or masking, the device outputs when the clock inputs and test patterns are applied.

6. Method, according to claim 1, further comprising: saving and merging the resultant states of the outputs read during the three passes to arrive at a valid indication of the performance of the device with a free running clock.

* * * * *